(12) United States Patent
Wu

(10) Patent No.: US 11,329,245 B2
(45) Date of Patent: May 10, 2022

(54) ELECTRON TRANSPORT THIN FILM AND FORMATION METHOD AND LIGHT EMITTING DIODE DEVICE

(71) Applicant: TCL TECHNOLOGY GROUP CORPORATION, Huizhou (CN)

(72) Inventor: Longjia Wu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 0 days.

(21) Appl. No.: 16/906,727

(22) Filed: Jun. 19, 2020

(65) Prior Publication Data

US 2020/0321547 A1 Oct. 8, 2020

Related U.S. Application Data

(63) Continuation of application No. PCT/CN2018/123505, filed on Dec. 25, 2018.

(30) Foreign Application Priority Data

Dec. 29, 2017 (CN) .......................... 201711472213.4

(51) Int. Cl.
- *H01L 51/50* (2006.01)
- *H01L 51/52* (2006.01)
- *H01L 51/56* (2006.01)

(52) U.S. Cl.
CPC ........ *H01L 51/5076* (2013.01); *H01L 51/502* (2013.01); *H01L 51/52* (2013.01); *H01L 51/56* (2013.01); *H01L 2251/303* (2013.01)

(58) Field of Classification Search
CPC ... H01L 51/5076; H01L 51/502; H01L 51/56; H01L 2251/303
See application file for complete search history.

(56) References Cited

U.S. PATENT DOCUMENTS

| | | | |
|---|---|---|---|
| 2011/0284825 | A1 | 11/2011 | Yang et al. |
| 2012/0138894 | A1 | 6/2012 | Lei et al. |

FOREIGN PATENT DOCUMENTS

| | | |
|---|---|---|
| CN | 101660120 A | 3/2010 |
| CN | 105762197 A | 7/2016 |
| CN | 106410051 A | 2/2017 |
| CN | 106549109 A | 3/2017 |

OTHER PUBLICATIONS

World Intellectual Property Organization (WIPO) International Search Report for PCT/CN2018/123505 dated Mar. 11, 2019 5 Pages.
The State Intellectual Property Office of People's Republic of China The Second Office Action for Application No. 201711472213.4, dated Aug. 17, 2020 46 pages (include translation).
European Patent Office Supplementary European Search Report for Application No. EP18896954 dated Jan. 26, 2021 13 pages.

(Continued)

*Primary Examiner* — Anthony Ho
(74) *Attorney, Agent, or Firm* — Anova Law Group, PLLC

(57) ABSTRACT

An electron transport thin film is comprised of nano-zinc oxide doped with metal ions. The nano-zinc oxide doped with the metal ions is nano-zinc oxide having a surface enriched with the metal ions.

6 Claims, 2 Drawing Sheets

(56) References Cited

OTHER PUBLICATIONS

Yong Hun Lee et al., "Efficiency enhancement of inverted organic photovoltaic cells due to an embedded Ce-doped ZnO electron transport layer synthesized by using a sol-gel process", Journal of Sol-gel Science and Technology, Jul. 31, 2015, pp. 644-650, vol. 76, No. 3, New York.
Sahil Goel et al., "Experimental investigation on the structural, dielectric, ferroelectric and piezoelectric properties of La doped ZnO nanoparticles and their application in dye-sensitized solar cells", Physica E: Low-dimensional Systems and Nanostructures, Jul. 1, 2017, pp. 72-81, vol. 91.
Jingling Li et al., "Improved performance of quantum dot light emitting diode by modulating electron injection with yttrium-doped ZnO nanoparticles", Journal of Applied Physics, Oct. 5, 2017, p. 135501-1 and 135501-9.
Sayantan Das et al., "Optimization of the zinc oxide electron transport layer in P3HT:PC61BM based organic solar cells by annealing and yttrium doping", RSC Advances, Jan. 1, 2015, pp. 45586-45591, vol. 5, No. 57.
Shouqin Tian et al., "Surface doping of La ions into ZnO nanocrystals to lower the optimal working temperature for HCHO sensing properties", Physical Chemistry Chemical Physics, Jan. 1, 2015, pp. 27437-27445, vol. 17, No. 41.
Meichen Shao, Pauling's rules and valence-bond theory, Apr. 30, 1993, p. 70-75.

ELECTRON TRANSPORT THIN FILM AND FORMATION METHOD AND LIGHT EMITTING DIODE DEVICE

CROSS-REFERENCE TO RELATED APPLICATION

This application is a continuation application of International Application No. PCT/CN2018/123505, filed on Dec. 25, 2018, which claims priority to Chinese Application No. 201711472213.4 filed on Dec. 29, 2017. The entire content of which is incorporated herein by reference.

TECHNICAL FIELD

The present disclosure relates to the technical field of display technology and, more particularly, to an electron transport thin film and formation method and light emitting diode device.

BACKGROUND

Recently, with the development of the display technology, quantum dot light-emitting diodes (QLED) including a light-emitting layer made of quantum dot material are showing tremendous application perspectives. Because QLED has desired features such as high light-emitting efficiency, controllable light-emitting colors, high color purity, superior device stability, and flexibility, QLED becomes more and more popular in the fields of display technology and solid-state lighting, etc.

In recent years, the nano-zinc oxide electron transport layer formed by depositing a zinc oxide colloid solution has become the primary electron transport layer used in the quantum dot light-emitting diodes. The electron transport layer has a good energy level matching relationship with a cathode and a quantum dot light-emitting layer, and substantially reduces an injection barrier of electrons from the cathode to the quantum dot light-emitting layer. Its substantially deep valence band energy level serves as a function for effectively blocking-holes. In addition, the nano-zinc oxide electron transport layer is excellent in transporting electrons and has an electron mobility as high as $10^{-3}$ cm$^2$/V·S or more. These features make the nano-zinc oxide electron transport layer a primary candidate for the quantum dot light-emitting diodes to substantially improving the stability and light-emitting efficiency of the devices.

At the same time that the nano-zinc oxide material brings the excellent performance to the quantum dot light-emitting diodes, the features of the material also cause problems that cannot be ignored. On one hand, because a particle size of the zinc oxide nanoparticles for forming the nano-zinc oxide electron transport layer often approaches or is even smaller than 5 nm, under such circumstance, the zinc oxide nanoparticles have substantially large specific surface area. The resulted large surface energy makes the zinc oxide nanoparticles substantially unstable, causing agglomeration to reduce the effect of the surface energy. Once the agglomeration occurs, it will inevitably cause a damaging effect on film formation of the zinc oxide colloid solution and conductivity of the formed film. Thus, to prevent the agglomeration from occurring to the zinc oxide particles, surface ligands are often added to the zinc oxide colloid solution and are attached to the zinc oxide nanoparticles, thereby ensuring the stability of the nanoparticles. However, at the same time, the existence of the surface ligands increases a distance of electron transition in the nano-zinc oxide electron transport layer of the formed film, which will hinder the electron transport in the zinc oxide material, thereby degrading the conductivity of the nano-zinc oxide electron transport layer. On the other hand, the effect of surface defects on the nanomaterials cannot be ignored. Compared with the bulk phase of the material, the surface of the material includes many defects. When the quantum dot light-emitting diode emits light, the surface defects act as non-composite radiation centers to quench excitons. Because the nano-zinc oxide material has the substantially large specific surface area, the quenching effect of the surface defects of the nano-zinc oxide material becomes more obvious and substantially reduces the light-emitting efficiency of the quantum dot light emitting diodes.

Technical Problem

The present invention provides an electron transport thin film and formation method and a QLED device including the electron transport thin film to solve the problem that the in the existing zinc oxide material electron transport layer, the surface ligands of the nano-zinc oxide hinder the electron transport and the surface defects of the nano-zinc oxide quench the excitons.

SUMMARY

In accordance with the disclosure, there is provided an electron transport thin film including: nano-zinc oxide doped with metal ions. The nano-zinc oxide doped with the metal ions is nano-zinc oxide having a surface enriched with the metal ions.

Also in accordance with the disclosure, there is provided a method for forming an electron transport thin film including: providing a mixed solution including a zinc salt, a metal salt containing dopant metal ions, and an alkali to form zinc oxide nanoparticles containing the dopant metal ions; and depositing the solution of the zinc oxide nanoparticles containing the dopant metal ions on a substrate, and drying to form a film to obtain the electron transport thin film.

Also, in accordance with the disclosure, there is provided a light emitting diode device comprising an electron transport thin film. The electron transport thin film is comprised of nano-zinc oxide containing dopant metal ions. The nano-zinc oxide doped with the metal ions is nano-zinc oxide having a surface enriched with the metal ions. Or a method for forming an electron transport thin film includes: providing a mixed solution including a zinc salt, a metal salt containing dopant metal ions, and an alkali to form zinc oxide nanoparticles containing the dopant metal ions; and depositing the solution of the zinc oxide nanoparticles containing the dopant metal ions on a substrate, and drying to form a film to obtain the electron transport thin film.

Beneficial Effects

The electron transport layer provided by the present invention includes nano-zinc oxide doped with metal ions. The nano-zinc oxide doped with the metal ions is nano-zinc oxide having a surface enriched with the metal ions. On one hand, the zinc oxide nanomaterial has the surface of the nano-zinc oxide material enriched with the metal ion dopant, which substantially improves the stability of the zinc oxide nanoparticles. Thus, the surface ligands can be avoided in the zinc oxide nanomaterial, the surface ligands will not be introduced to hinder the electron transport in the zinc oxide material, and the conductive performance of the nano-zinc oxide electron transport layer is further optimized. On the other hand, the metal ion dopant enriched on the surface of the nano-zinc oxide substantially reduces the surface defects of the nano-zinc oxide material. Thus, the effect of quenching the excitons due to the material surface defects is reduced, and the overall light-emitting efficiency and device performance of the QLED device including the electron transport thin film are improved.

In the method for forming the electron transport thin film according to the embodiments of the present invention, the mixed solution including the zinc salt, the metal salt containing the dopant metal ions, and the alkali is used to form the zinc oxide nanoparticles containing the dopant metal ions, and the thin film is formed through the solution method. The method is simple, low cost, and easy to operate. The method has little restriction on fabrication equipment, has good repeatability, and facilitates large scale production.

Because the light-emitting diode provided by the present invention includes the above-described electron transport thin film, the light emitting efficiency and the performance of the device is substantially improved.

DETAILED DESCRIPTION OF THE EMBODIMENTS

To make the objective, the technical solution, and the advantages of the present invention clearer, the present invention will be further described in detail below with reference to the accompanying drawings and embodiments. It should be understood that the specific embodiments described herein are only used to ex the present invention, and are not intended to limit the present invention.

In the description of the present invention, it should be understood that the terms "first" and "second" are used for purposes of description only, and cannot be construed as indicating or implying relative importance or implicitly indicating the number of technical features indicated. Thus, the features defined as "first" and "second" may explicitly or implicitly include one or more of the features. In the description of the present invention, the meaning of "a plurality of" is two or more, unless otherwise specifically limited.

The present invention provides an electron transport thin film. The electron transport thin film is comprised of the nano-zinc oxide containing metal ion dopant, and the nano-zinc oxide doped with the metal ions is a nano-zinc oxide having the surface enriched with the metal ions.

After the metal ions are doped into another metal oxide host material, three possible doping structures may be formed between the doped metal ions and the host material. In one doping structure, the dopant metal ions enter a crystal structure of the host material and displace the metal ions of the host material to form a solid solution (e.g., as described in Chinese patent document CN201610939765.0, after metal ions are doped into a metal oxide host material, the dopant ions enter the crystal structure of the host material and displace the metal ions of the host material.) The more metal ions are doped, the higher the concentration of free electrons is, and the stronger the conductivity is. In another doping structure, the dopant metal ions are precipitated from the host material in the form of impurities and are not able to form a unified structure. In another doping structure, the dopant metal ions are aggregated on the surface of the metal oxide host material to form a surface enrichment phenomenon. The surface enrichment refers to that in the metal oxide host material doped with the metal ions, the dopant metal ions are concentrated on the surface of the metal oxide, resulting in a concentration of the metal ions on the surface of the metal oxide higher than the concentration of the metal ions in the bulk phase of the metal oxide.

Figure 1:
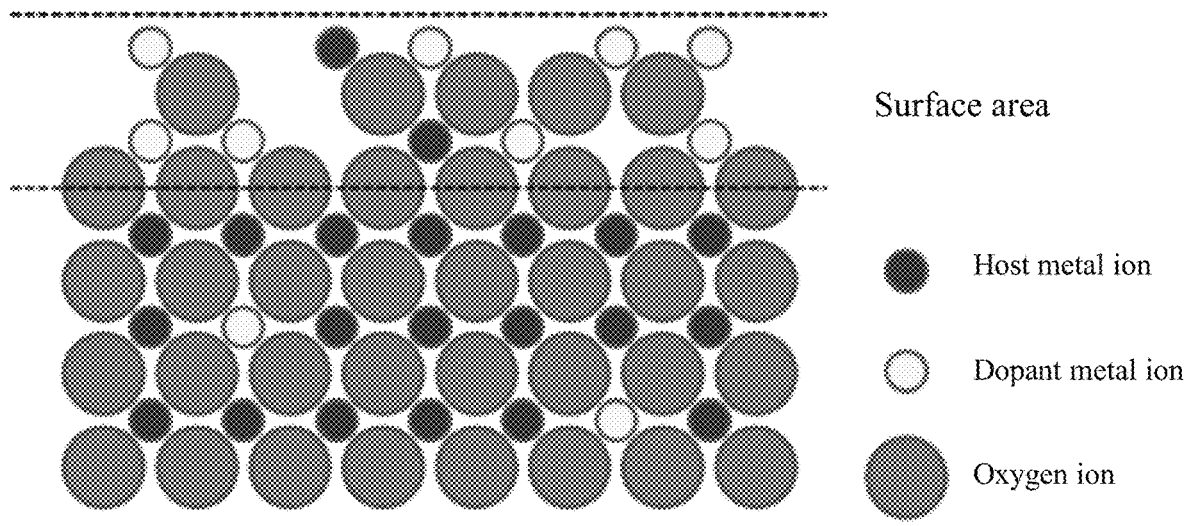
FIG. 1 is a schematic diagram of an enrichment phenomenon of a doped metal surface according to an example embodiment of the present disclosure.

Regarding the surface enrichment phenomenon, as shown in FIG. 1, most of the dopant metal ions enter the surface of the metal oxide host material, occupy defect positions such as the metal ion vacancies of the host material, and maintain the crystal structure of the host material. In other words, in the metal oxide host material having the surface enrichment of the dopant ions, the entire host material including the surface thereof contains only a single crystal phase, and does not contain a second phase other than the crystal phase structure of the metal oxide host material. Thus, the uniformity of the overall material performance is ensured. At the same time, when the surface enrichment phenomenon occurs, the surface property of the host material changes substantially. On one hand, according to Gibbs surface absorption equation, the surface enrichment phenomenon of the dopant metal ions substantially reduces the surface energy of the metal oxide host material, and substantially increases the stability of the metal oxide host material, especially, the stability of the nano-metal oxide host material having the substantially large specific surface area. On the other hand, because the dopant metal ions enriched on the surface occupy a large number of defect positions on the surface of the metal oxide host material, the defects are passivated such that the defect concentration on the surface of the metal oxide host material is reduced substantially.

In view of this, in the embodiments of the present invention, suitable dopant metal ions are selected to dope the nano-zinc oxide material to enrich the surface of the nano-zinc oxide particles. Thus, the stability of the zinc oxide nanoparticles is substantially increased, and the use of the surface ligands and the subsequent degradation of the conductivity performance of the nano-zinc oxide electron transport layer can be avoided. At the same time, the surface defect concentration of the nano-zinc oxide material is reduced substantially, the effect of quenching the excitons by the surface defects of the nano-zinc oxide material is reduced, and the light emitting efficiency of the light emitting diode such as the QLED device is improved.

The electron transport thin film provided by the embodiments of the present invention is comprised of nano-zinc oxide containing the dopant metal ions. The nano-zinc oxide doped with the metal ions is the nano-zinc oxide having the surface enriched with the metal ions. On one hand, the surface of the zinc oxide material is enriched with the dopant metal ions to substantially increase the stability of the zinc oxide nanoparticles. Thus, the use of the surface ligands can be avoided in the zinc oxide nanomaterial, the hindering of the electron transport in the zinc oxide material caused by the use of the surface ligands can be avoided, and the conductivity performance of the nano-zinc oxide electron transport layer is further optimized. On the other hand, the enrichment of the metal ions on the surface of the nano-zinc oxide substantially reduces the surface defects of the nano-zinc oxide material. Thus, the effect of quenching the excitons by the material surface defects is reduced, the overall light emitting efficiency and device performance of the light emitting diode such as the QLED device including the electron transport thin film are improved.

Specifically, to make the surface enrichment occur on the surface of the nano-zinc oxide material doped with the metal ions, the dopant metal ions are selected to meet following two requirements. In one requirement, the valence state of the dopant metal ions is not positive divalent. That is, the valence state of the dopant metal ions is different from the valence state of $Zn^{2+}$. Because many defects are present on the surface of the zinc oxide nanomaterial, the surface of the zinc oxide material is not electrically neutral, and electric charge may be accumulated locally. Thus, when the metal ions of different valence state are doped into the nano-zinc oxide material, the dopant metal ions of different valence state bring in many free electrons or holes, the generated free electrons or holes is likely to enrich the surface of the nanomaterial and neutralize the electric charge on the surface, and the dopant metal ions are enriched on the surface of the nano-zinc oxide. In another requirement, the radius of the dopant metal ions is substantially larger than the radius of $Zn^{2+}$ ions. Specifically, the radius of the dopant metal ions is ranging approximately between 130% and 200% of the radius of $Zn^{2+}$ ions. That is, the radius of the dopant metal ions is more than 30% larger than the radius of $Zn^{2+}$ ions and no more than twice as the radius of $Zn^{2+}$ ions. The dopant metal ions having the radius within this range enter the zinc oxide crystal structure to substantially deform the crystal structure due to the larger ion radius. The severe kinetic instability caused by the crystal structure deformation makes the dopant metal ions to enrich on the surface of the nano-zinc oxide and occupies defect positions such as the zinc ion vacancies instead of entering the crystal structure to internally displace the zinc ion position. Thus, the metallographic structure of the host material nano-zinc oxide is protected, and the uniformity of the material performance is ensured. When the ion radius of the dopant metal ions approaches the ion radius of the of $Zn^{2+}$ ions, the dopant metal ions are likely to enter the crystal structure of the zinc oxide material to displace the $Zn^{2+}$ positions to form the solid solution, thereby degrading the electrical properties of the nano-zinc oxide. When the ion radius of the dopant metal ions is more than twice as the ion radius of $Zn^{2+}$ ions, the overly large dopant metal ions are unlikely to enter the zinc ion vacancies on the surface of the zinc oxide material. Instead, the dopant metal ions are directly precipitated from the surface of the zinc oxide material in the form of a second phase to severely degrade the conductivity performance of the nano-zinc oxide electron transport layer. In the embodiments of the present invention, the dopant metal ions can be widely selected as long as the valence state of the dopant metal ions is different from the valence state of $Zn^{2+}$ ions and the ion radius of the dopant metal ions is substantially large than the radius of $Zn^{2+}$ ions. Thus, specific requirements of the electron transport thin film may be selected according to practical applications to achieve strong applicability and practicality.

Optionally, the dopant metal ions are rare earth metal ions. As the dopant metal ions, the rare earth metal ions satisfy the above-described two conditions. With respect to the nano-zinc oxide host material, the desired surface enrichment phenomenon is likely to occur.

Optionally, the dopant metal ions are selected from at least one of $La^{3+}$, $Y^{3+}$, $Gd^{3+}$, or $Ce^{4+}$. In other words, the dopant metal ions may be any one selected from said group, for example, $La^{3+}$, or $Y^{3+}$; the dopant metal ions may be any two selected from said group, for example, $La^{3+}$ and $Y^{3+}$; or $Gd^{3+}$ and $Ce^{4+}$; or $Y^{3+}$ and $Gd^{3+}$; and the dopant metal ions may be any three selected from said group, for example, $La^{3+}$, $Y^{3+}$, and $Gd^{3+}$; or $Y^{3+}$, $Gd^{3+}$, and $Ce^{4+}$; etc. The preferred dopant metal ions are used to form the electron transport thin film to successfully enrich the surface of the nano-zinc oxide material with the dopant ions. In some embodiments, the ion radius differences between $La^{3+}$, $Y^{3+}$, $Gd^{3+}$, or $Ce^{4+}$ and zinc ions are illustrated in the Table 1 below. The equation for calculating the ion radius difference is $$\frac{r_{M^{n+}} - r_{Zn^{2+}}}{r_{Zn^{2+}}},$$

where r represents the radius and $M^{n+}$ represents dopant metal ions.

TABLE 1

|  | $Zn^{2+}$ | $La^{3+}$ | $Y^{3+}$ | $Gd^{3+}$ | $Ce^{4+}$ |
| --- | --- | --- | --- | --- | --- |
| Ion radius (Å) | 0.60 | 1.03 | 0.90 | 0.94 | 0.87 |
| Ion radius difference (%) |  | 73 | 50 | 56 | 45 |

In some embodiments, in addition to the valence state of the dopant metal ions and the ion radius that cause the surface enrichment of the dopant ions to occur, the dopant molar concentration of the metal ions also affects the surface enrichment of the dopant ions. Compared with the number of positions of the metal ions in the bulk phase of the material, the number of defect positions such as vacancies of the host metal ions on the material surface is limited. Once the number of dopant ions exceeds the number of occupiable surface defect positions, the excess dopant metal ions are precipitated from the host material in the form of the second phase, thereby damaging the original property of the host material. In addition, the larger the ion radius of the dopant metal ions, the fewer the defect positions such as the occupiable host metal ion vacancies on the surface of the host material. Under the circumstance that the second phase is not generated, the molar concentration of the usable dopants is lower. On the other hand, when the number of the dopant metal ions is substantially small, because the substantially small number of the dopant metal ions are unable to obviously deform the crystal structure, the dopant metal ions may still be able to enter the bulk phase of the zinc oxide material to form the slid solution without causing the surface enrichment of the dopant metal ions on the surface of the zinc oxide material. Thus, it is important to control the molar concentration of the dopant metal ions.

Optionally, the dopant metal ions account for less than approximately between 0.05% and 10% of the total molar concentration of metal elements in the electron transport thin film. However, specifically, it needs to be determined in combination with the type of the dopant metal ions. When the molar concentration of the dopant metal ions is too low, some of the dopant metal ions can still enter the bulk phase of the zinc oxide nanoparticles to form a solid solution. In this case, the number of the dopant metal ions on the surface and the number of the dopant metal ions in the bulk phase are relatively close, which is not conclusive to the formation of the surface enrichment of the dopant ions. When the molar concentration of the dopant metal ions is too high, the dopant metal ions enter the bulk phase of the zinc oxide nanoparticles to severely deform the crystal structure, such that newly added dopant metal ions excessively enrich the surface of the zinc oxide nanoparticles. In this case, the dopant metal ions are precipitated from the surface of the zinc oxide material in the form of the second phase, thereby severely degrading the electrical property of the zinc oxide material.

In some embodiments, only one type of dopant metal ions is needed to improve the conductivity performance of the zinc oxide electron transport layer and at the same time increase the light emitting efficiency of the QLED device. The doping effect is desirable. In the examples below, the electron transport thin film is the nano-zinc oxide electron transport thin film containing one type of dopant metal ions.

When the dopant metal ions are $La^{3+}$ ions and the total molar concentration of the metal element in the electron transport thin film is 100%, the molar concentration of the dopant $La^{3+}$ ions is approximately between 0.05% and 5%. When the molar concentration of the dopant $La^{3+}$ ions is within this range, the ratio of the mole number of the $La^{3+}$ ions on the surface of the zinc oxide nanoparticles over the mole number of the $La^{3+}$ ions in the bulk phase of the zinc oxide nanoparticles is approximately between 4:1 and 30:1, and the ratio of the number of the $La^{3+}$ ions on the surface over the number of the $La^{3+}$ ions in the bulk phase is approximately between 4:1 and 30:1, such that the surface enrichment of the dopant ions is formed. Within this range, the higher the content of the dopant metal ions, the more obvious the surface enrichment phenomenon.

When the dopant metal ions are $Y^{3+}$ ions and the total molar concentration of the metal element in the electron transport thin film is 100%, the molar concentration of the dopant $Y^{3+}$ ions is approximately between 0.1% and 10%. When the molar concentration of the dopant $Y^{3+}$ ions is within this range, the ratio of the mole number of the $Y^{3+}$ ions on the surface of the zinc oxide nanoparticles over the mole number of the $Y^{3+}$ ions in the bulk phase of the zinc oxide nanoparticles is approximately between 2:1 and 40:1, and the ratio of the number of the $Y^{3+}$ ions on the surface over the number of the $Y^{3+}$ ions in the bulk phase is approximately between 2:1 and 40:1, such that the surface enrichment of the dopant ions is formed. Within this range, the higher the content of the dopant metal ions, the more obvious the surface enrichment phenomenon.

When the dopant metal ions are $Gd^{3+}$ ions and the total molar concentration of the metal element in the electron transport thin film is 100%, the molar concentration of the dopant $Gd^{3+}$ ions is approximately between 0.1% and 8%. When the molar concentration of the dopant $Gd^{3+}$ ions is within this range, the ratio of the mole number of the $Gd^{3+}$ ions on the surface of the zinc oxide nanoparticles over the mole number of the $Gd^{3+}$ ions in the bulk phase of the zinc oxide nanoparticles is approximately between 3:1 and 35:1, and the ratio of the number of the $Gd^{3+}$ ions on the surface over the number of the $Gd^{3+}$ ions in the bulk phase is approximately between 3:1 and 35:1, such that the surface enrichment of the dopant ions is formed. Within this range, the higher the content of the dopant metal ions, the more obvious the surface enrichment phenomenon.

When the dopant metal ions are $Ce^{4+}$ ions and the total molar concentration of the metal element in the electron transport thin film is 100%, the molar concentration of the dopant $Ce^{4+}$ ions is approximately between 0.2% and 10%. When the molar concentration of the dopant $Ce^{4+}$ ions is within this range, the ratio of the mole number of the $Ce^{4+}$ ions on the surface of the zinc oxide nanoparticles over the mole number of the $Ce^{4+}$ ions in the bulk phase of the zinc oxide nanoparticles is approximately between 2:1 and 40:1, and the ratio of the number of the $Ce^{4+}$ ions on the surface over the number of the $Ce^{4+}$ ions in the bulk phase is approximately between 2:1 and 40:1, such that the surface enrichment of the dopant ions is formed. Within this range, the higher the content of the dopant metal ions, the more obvious the surface enrichment phenomenon.

In some embodiments, the thickness of the electron transport thin film is approximately between 10 nm and 100 nm. When the thickness of the electron transport thin film is smaller than 10 nm, the thin film is likely to be penetrated by electrons and is unable to ensure injection performance of carriers. When the thickness of the electron transport thin film is greater than 100 nm, the injection of electrons is likely to be hindered and the balance of electric charge injection of the device is affected.

The electron transport thin film in the embodiments of the present invention can be formed by the following method.

Figure 2:
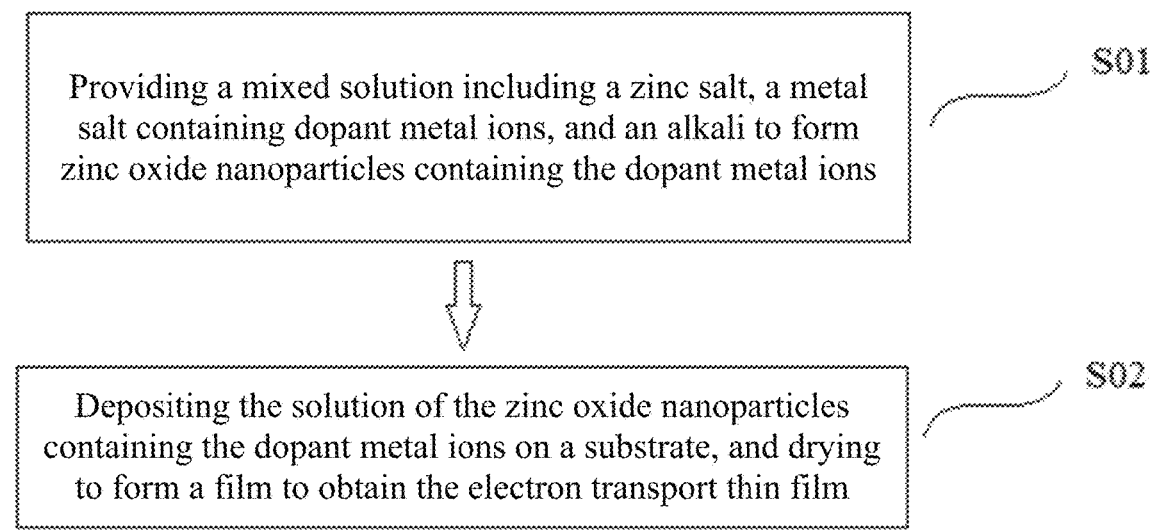
FIG. 2 is a schematic flowchart of a method for forming an electron transport thin film according to an example embodiment of the present disclosure.

Correspondingly, as shown in FIG. 2, the present invention provides a method for forming an electron transport thin film. The method includes the following steps.

At S01, a mixed solution including a zinc salt, a metal salt containing dopant metal ions, and an alkali is provided to form a zinc oxide nanoparticles containing the dopant metal ions.

At S02, the solution of the zinc oxide nanoparticles containing the dopant metal ions is deposited onto a substrate and is dried to form a thin film, and an electron transport thin film is obtained.

In the method for forming the electron transport thin film according to the embodiments of the present invention, the mixed solution including the zinc salt, the metal salt containing the dopant metal ions, and the alkali is used to form the zinc oxide nanoparticles containing the dopant metal ions, and the thin film is formed through the solution method. The method is simple, low cost, and easy to operate. The method has little restriction on fabrication equipment, has good repeatability, and facilitates large scale production.

Specifically, at step S01, the mixed solution including the zinc salt, the metal salt containing the dopant metal ions, and the alkali is formed by dissolving the zinc salt, the metal salt and the metal alkali containing the dopant metal ions into a solvent.

In this case, the zinc salt is used as a zinc source to provide zinc for forming the zinc oxide nanoparticles containing the dopant metal ions. Specifically, the zinc salt includes, but is not limited to, one of zinc acetate, zinc nitrate, zinc sulfate, and zinc chloride, etc.

The metal salt containing the dopant metal ions is used to form the zinc oxide nanoparticles containing the dopant metal ions to provide the dopant metal ions. The type of the dopant metal ions satisfies: the valence state of the dopant metal ions is not positive divalent, and the ion radius of the dopant metal ions is approximately between 130% and 200% of the ion radius of $Zn^{2+}$ ions. The above description can be referred for the details. Optionally, the dopant metal ions are selected from rare earth metal ions, specifically from at least one of $La^{3+}$, $Y^{3+}$, $Gd^{3+}$, or $Ce^{4+}$. In other words, the dopant metal ions may be any one selected from said group, for example, $La^{3+}$, or $Y^{3+}$; the dopant metal ions may be any two selected from said group, for example, $La^{3+}$ and $Y^{3+}$; or $Gd^{3+}$ and $Ce^{4+}$; and the dopant metal ions may be any three selected from said group, for example, $La^{3+}$, $Y^{3+}$, and $Gd^{3+}$; or $Y^{3+}$, $Gd^{3+}$, and $Ce^{4+}$; etc. Specifically, the metal salt containing the dopant metal ions may be selected from at least one of lanthanum sulfate, lanthanum chloride, lanthanum nitrate, lanthanum acetate, yttrium sulfate, yttrium chloride, yttrium acetate, yttrium nitrate, gadolinium nitrate, gadolinium acetate, gadolinium sulfate, gadolinium chloride, cerium chloride, cerium acetate, cerium sulfate, cerium chloride, and metal salt hydrates thereof, but is not limited thereto. In other words, the metal salt containing the dopant metal ions may be any one selected from said group, for example, lanthanum sulfate, or lanthanum chloride; the metal salt containing the dopant metal ions may be any two selected from said group, for example, lanthanum sulfate and lanthanum chloride; or lanthanum nitrate and lanthanum acetate; and the metal salt containing the dopant metal ions may be any three selected from said group, for example, lanthanum sulfate, lanthanum chloride, and lanthanum nitrate; or lanthanum chloride, lanthanum nitrate, and lanthanum acetate; etc.

In some embodiments, the mixed solution including the zinc salt, the metal salt containing the dopant metal ions, and the alkali is used to form the zinc oxide nanoparticles containing the dopant metal ions. The reaction process includes: the zinc ions in the zinc salt and the dopant metal ions in the metal salt react with an alkali solution to form a hydroxide intermediate, and subsequently, the hydroxide intermediate undergoes a polycondensation reaction to gradually generate the dopant zinc oxide nanoparticles. The alkali provides hydroxide ions for the reaction. Specifically, the alkali is selected from at least one of lithium hydroxide, sodium hydroxide, potassium hydroxide, TMAH, ammonia, ethanolamine, or ethylenediamine. In other words, alkali may be any one selected from said group, for example, lithium hydroxide, or sodium hydroxide; alkali may be any two selected from said group, for example, lithium hydroxide and sodium hydroxide; or potassium hydroxide and TMAH; and alkali may be any three selected from said group, for example, lithium hydroxide, sodium hydroxide, and potassium hydroxide; or sodium hydroxide, potassium hydroxide, and TMAH; etc.

In some embodiments, the solvent for forming the mixed solution including the zinc salt, the metal slat containing the dopant metal ions, and the alkali may be an organic solvent or an inorganic solvent. Specifically, the solvent may be selected from at least one of water, methanol, ethanol, propanol, butanol, ethylene glycol, ethylene glycol monomethyl ether, or DMSO, but is not limited thereto.

Optionally, in the mixed solution including the zinc salt, the metal salt containing the dopant metal ions, and the alkali, the dopant metal ions account for approximately between 0.05% and 10% of the total molar concentration of the metal ions. When the dopant molar concentration of the dopant metal ions is too low, some of the dopant metal ions can still enter the bulk phase of the zinc oxide nanoparticles to form a solid solution. In this case, the number of the dopant metal ions on the surface and the number of the dopant metal ions in the bulk phase are relatively close, which is not conclusive to the formation of the surface enrichment of the dopant ions. When the molar concentration of the dopant metal ions is too high, the dopant metal ions enter the bulk phase of the zinc oxide nanoparticles to severely deform the crystal structure, such that newly added dopant metal ions excessively enrich the surface of the zinc oxide nanoparticles. In this case, the dopant metal ions are precipitated from the surface of the zinc oxide material in the form of the second phase, thereby severely degrading the electrical property of the zinc oxide material.

Optionally, in the mixed solution including the zinc salt, the metal salt containing the dopant metal ions, and the alkali, the molar ratio of the hydroxide ions to the metal ions is approximately between 1.5:1 and 2.5:1 to ensure the formation of the dopant zinc oxide nanoparticles and to reduce the formation of any reaction by-products. When the molar ratio of the hydroxide ions to the metal ions is smaller than 1.5:1, the metal salt is substantially excessive, resulting in a large amount of the metal salt unable to produce the dopant zinc oxide nanoparticles. When the molar ratio of the hydroxide ions to the metal ions is greater than 2.5:1, the alkaline solution is substantially excessive. The excessive hydroxide ions react with the hydroxide intermediate to form a stable complex and are unable to be polycondensed to produce the dopant zinc oxide nanoparticles. Optionally, in the mixed solution including the zinc salt, the metal salt containing the dopant metal ions, and the alkali, the molar ratio of the hydroxide ions to the metal ions is selected from approximately between 1.7:1 and 1.9:1.

In some embodiments, the mixed solution including the zinc slat, the metal salt containing the dopant metal ions, and the alkali may be obtained by dissolving the zinc salt, the metal salt containing the dopant metal ions, and alkali into a solvent. Optionally, the method for forming the mixed solution including the zinc salt, the metal salt containing the dopant metal ions, and the alkali includes:

dissolving the zinc salt and the metal salt containing the dopant metal ions into a solvent to obtain a salt solution; and adding an alkaline solution to the salt solution to obtain the mixed solution including the zinc salt, the metal salt containing the dopant metal ions, and the alkali.

The above process may be completed at room temperature (between 10° C. and 30° C.). The alkaline solution may be a solution in which the alkali is dissolved or diluted in another solvent that is the same as or different from the solvent used for dissolving the zinc salt and the metal salt containing the dopant metal ions.

In this way, the zinc salt and the metal salt containing the dopant metal ions can be fully dissolved and mixed evenly. Under this condition, the alkaline solution is further added to make the reaction to proceed uniformly.

The process for providing the mixed solution including the zinc salt, the metal salt containing the dopant metal ions, and the alkali to form the zinc oxide nanoparticles containing the dopant metal ions includes: at the condition of approximately between 0° C. and 70° C., the mixed solution including the zinc salt, the metal salt containing the dopant metal ions, and the alkali is used to form the zinc oxide nanoparticles containing the dopant metal ions. The above temperature range ensures the formation of the zinc oxide nanoparticles containing the dopant metal ions with desired particle dispersibility. When the reaction temperature is lower than 0° C., the reaction temperature is too low, the formation of the zinc oxide nanoparticles is substantially slowed down or the zinc oxide nanoparticles cannot even be generated, and only the hydroxide intermediate is obtained. When the reaction temperature is higher than 70° C., the nanoparticles are poorly dispersed and are agglomerated, thereby affecting the film formation of the dopant zinc oxide colloid solution. Optionally, the reaction temperature is approximately between 10° C. and 60° C. Further, the reaction time is approximately between 30 minutes and 240 minutes to ensure the formation of the dopant zinc oxide nanoparticles and to control the particle size of the nanoparticles. When the reaction time is less than 30 minutes, the reaction time is too short. The dopant zinc oxide nanoparticles are not fully formed, and the crystallinity of the resulting nanoparticles is poor. When the reaction time is more than 4 hours, the excessively long particle growth time makes the generated nanoparticles too large and the particle size uneven, thereby affecting the film formation of the dopant zinc oxide colloid solution. Optionally, the reaction is approximately between 1 hour and 2 hours.

Further, after the reaction is completed, the method also includes adding a precipitant to the reaction solution to generate a white precipitate in the mixed solution (precipitation process), and performing a centrifugation process to obtain the zinc oxide nanoparticles containing the dopant metal ions. The volume ratio of the precipitant to the reaction system solution is approximately between 2:1 and 6:1, which prevents excessive amount of the precipitant from damaging the solubility of the dopant zinc oxide particles while ensuring sufficiently precipitating the zinc oxide nanoparticles containing the dopant metal ions. Optionally, the volume ratio of the precipitant to the reaction system solution is approximately between 3:1 and 5:1. The precipitant is one of less polarized solvents, including but not limited to ethyl acetate, n-hexane, n-heptane, and acetone, etc. After the centrifugation process is performed, the white precipitate is again dissolved into the reaction solution. A cleaning processes is performed repeatedly to remove the residual reactants that did not participate in the reaction. The final white precipitate is collected and dissolved in the solvent to obtain the dopant zinc oxide colloid solution containing the metal ions having a large ion radius and a different valence state. That is, the colloid solution of the zinc oxide nanoparticles containing the dopant metal ions is obtained.

In some embodiments, the low temperature solution method is used to synthesize the dopant zinc oxide colloid solution. In the entire reaction process of the low temperature solution method (the mixed solution comprised of the zinc salt and the metal salt containing the dopant metal ions reacts with the alkaline solution to form a hydroxide intermediate, and then the hydroxide intermediate undergoes a polycondensation reaction to gradually generate the dopant zinc oxide nanoparticles), the dopant zinc oxide nanoparticles are formed in the liquid phase. The existence of the liquid phase provides an excellent medium for the dopant metal ions to transfer and diffuse in the zinc oxide nanoparticles, such that the dopant metal ions satisfying the previously described two requirements diffuse to the surface of the zinc oxide nanoparticles in a short period of time. Thus, the surface enrichment of the metal ions is ensured to occur from the perspective of kinetics.

At step S02, the mixed solution of the zinc oxide nanoparticles containing the dopant metal ions is deposited on the substrate. The substrate can be selected without stringent limitations. The substrate may be an ordinary substrate for depositing the electron transport thin film or a function substrate where a function layer has already been deposited and the electron transport thin film needs to be deposited. For example, the function substrate includes an anode and a light emitting layer that have already been deposited and stacked, and the electron transport thin film will be deposited on the light emitting layer.

The deposition method is not stringently limited either. Based on the colloid solution properties of the solution of the zinc oxide nanoparticles containing the dopant metal ions, any solution processing method may be used. Specifically, the deposition method may include, but is not limited to, one of a spin coating method, a blade coating method, a printing method, a spray coating method, a roll coating method, and an electrodeposition method, etc.

Further, a film deposited with the solution of the zinc oxide nanoparticles containing the metal ions is dried to form the thin film. The drying process may be low temperature annealing. The temperature for the low temperature annealing process may be selected to allow the solvent in the dopant zinc oxide colloid solution to vaporize. A substantially high temperature is not required. The specific temperature may be determined by the boiling point of the solvent in the dopant zinc oxide colloid solution. Specifically, the low temperature annealing process may be performed at the temperature approximately between the room temperature and 150° C. The substantially high temperature may inadvertently damage the quantum dot light emitting layer that has already been deposited on the substrate. The low temperature annealing process needs to be performed under an inert gas environment to protect the quantum dot light emitting layer deposited on the substrate from being damaged.

The present invention also provides a light emitting diode device. The light emitting diode includes an electron transport thin film. The electron transport thin film is comprised of nano-zinc oxide containing dopant metal ions. The nano-zinc oxide containing the dopant metal ions is the nano-zinc oxide having a surface enriched with the metal ions.

In some embodiments, the method for forming the electron transport thin film include the following steps.

A mixed solution including a zinc salt, a metal salt containing the dopant metal ions, and an alkali is provided to form a solution of zinc oxide nanoparticles containing the dopant metal ions.

The solution of the zinc oxide nanoparticles containing the dopant metal ions is deposited on a substrate, and is dried to form a film to obtain the electron transport thin film.

In some embodiments, the light emitting diode includes the electron transport thin film. The electron transport thin film is comprised of the nano-zinc oxide containing the dopant metal ions. The nano-zinc oxide containing the dopant metal ions is the nano-zinc oxide having the surface enriched with the metal ions. On one hand, the surface of the zinc oxide material is enriched with the dopant metal ions to substantially increase the stability of the zinc oxide nanoparticles. Thus, the use of the surface ligands can be avoided in the zinc oxide nanomaterial, the hindering of the electron transport in the zinc oxide material caused by the use of the surface ligands can be avoided, and the conductivity performance of the nano-zinc oxide electron transport layer is further optimized. On the other hand, the enrichment of the metal ions on the surface of the nano-zinc oxide substantially reduces the surface defects of the nano-zinc oxide material. Thus, the effect of quenching the excitons by the material surface defects is reduced, the overall light emitting efficiency and device performance of the light emitting diode such as the QLED device including the electron transport thin film are improved.

In the embodiments of the present invention, the electron transport thin film, the method for forming the electron transport thin film, and the preferred embodiments are described above. For brevity, the detail description is omitted.

Specifically, the light emitting layer may be an organic light emitting layer or a quantum dot light emitting layer. Correspondingly, when the light emitting layer is the organic light emitting layer, the light emitting diode is an organic light emitting diode (OLED) device. When the light emitting layer is the quantum dot light emitting layer, the light emitting diode is a quantum dot light emitting diode (QLED) device.

Figure 3:
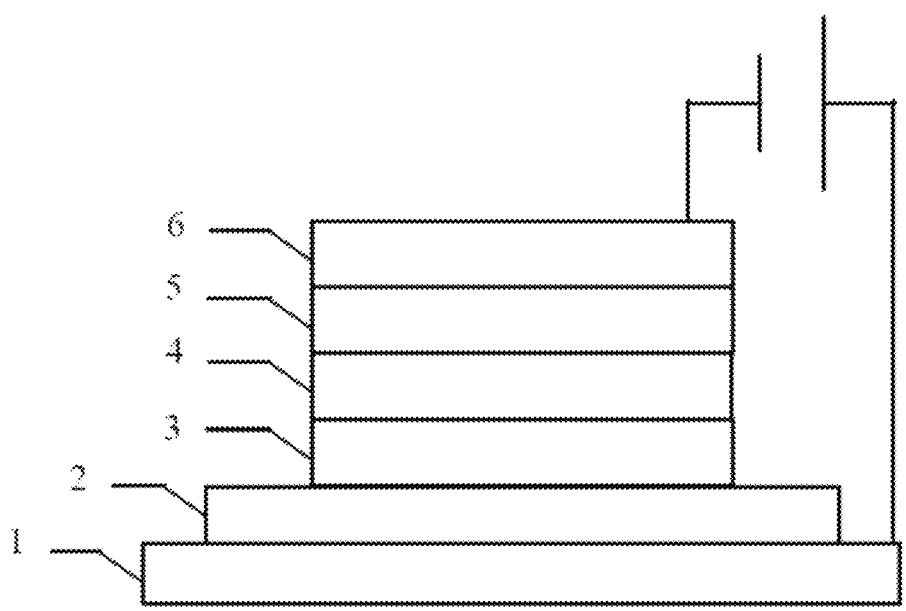
FIG. 3 is a schematic structural diagram of a light emitting diode according to an example embodiment of the present disclosure.

Optionally, the light emitting diode also includes a hole transport layer for promoting hole transport and carrier balance. In some embodiments, as shown in FIG. 3, the light emitting diode includes an anode 2, a hole transport layer 3, a light emitting layer 4, an electron transport layer 5, and a cathode 6 stacked and bonded on a substrate 1. The electron transport layer is the carrier transport thin film formed according to the above described method.

Specifically, the substrate may be a hard substrate or a flexible substrate.

Specifically, a glass substrate may be used.

The anode may be ITO, but not limited thereto.

The hole transport layer may be made of conventional hole transport materials in the art, including, but not limited to, TFB, PVK, Poly-TPD, TCTA, CBP, etc., or a mixture of any combination thereof, or other high-performance hole transport materials.

When the light emitting layer is the organic light emitting layer, the material of the light emitting layer may be selected from conventional organic light emitting materials. When the light emitting layer is the quantum dot light emitting layer, the quantum dot of the light emitting layer material may be one of the red, green, and blue quantum dots. Specifically, the quantum dot may be at least one of CdS, CdSe, CdTe, ZnO5, ZnS, ZnSe, ZnTe, GaAs, GaP, GaSb, HgS, HgSe, HgTe, InAs, InP, InSb, AlAs, AlP, CuInS, CuInSe, and various core-shell structure quantum dots or alloy structure quantum dots. The quantum dot may be obtained by mixing any of red, green, and blue quantum dots or other color (e.g., yellow) quantum dots. The quantum dot may or may not contain cadmium. A thickness of the light emitting layer is Optionally between 20 nm and 60 nm.

The electron transport layer is the above described electron transport thin film.

The cathode may be made of a metal cathode material, such as, metal silver or metal aluminum, or nano silver wire or nano-copper wire. The nano-silver wire or the nano-copper wire has substantially small resistance, which is beneficial to smooth injection of carriers. A thickness of the cathode is Optionally between 15 nm and 30 nm.

Further, the resulting light emitting diode is packaged.

Correspondingly, the present invention provides a method for forming a light emitting diode. The method includes the following steps.

At Q01, a light emitting layer is formed on an anode.

Specifically, a solution processing method is used. That is, after the light emitting layer material is dissolved into a light emitting material solution, the light emitting material solution is deposited on the surface of the anode. Further, the light emitting material solution is deposited to form a film by spin-coating. Specifically, the anode substrate is placed on a homogenizer. The formed light emitting material solution with a certain concentration is spin-coated to form the film. The thickness of the light emitting layer is controlled by adjusting the concentration of the solution, the spin-coating speed, and the spin-coating time. Then, an annealing process is performed at an appropriate temperature.

Optionally, before the light emitting layer is formed, the hole transport layer is formed on the anode.

The hole transport layer is formed in the same way as the light emitting layer. The solution processing method such as spin-coating is preferred. The film thickness is controlled by adjusting the solution concentration, the spin-coating speed, and the spin-coating time. Then, the annealing process is performed at an appropriate temperature.

At Q02, an electron transport layer is formed on the light emitting layer.

The electron transport layer is formed on the light emitting layer by the above described method for forming the electron transport thin film. The detail description is omitted.

At Q03, a cathode is formed on the electron transport layer.

Specifically, the substrate deposited with various function layers is placed in an evaporation chamber and the cathode is formed by thermally evaporated coating through a mask plate.

Further, the device is packaged. Optionally, the packaging condition includes an oxygen content lower than 0.1 ppm and a water content lower than 0.1 ppm to ensure the stability of the device.

Of course, the light emitting diode may be obtained by another method. Specifically, the method for forming the light emitting diode includes the following steps.

At Q01, an electron transport layer is formed on a cathode.

At Q02, a light emitting layer is formed on the electron transport layer.

At Q03, an anode is formed on the light emitting layer.

The above described embodiments can be referred for the methods for forming various layers.

The following describes specific embodiments.

Embodiment 1

A method for forming a lanthanum ion-doped nano-zinc oxide electron transport thin film includes the following steps.

First, an appropriate amount of zinc acetate and lanthanum sulfate is added to 50 ml of methanol solvent to form a mixed salt solution with a total concentration of 0.1 mol/L. The doping molar concentration of $La^{3+}$ is 3%. At the same time, an appropriate amount of potassium hydroxide powder is dissolved into another 50 ml methanol solvent to form an alkaline solution with a concentration of 0.3 mol/L. Then, the mixed salt solution is heated to 50° C., and a potassium hydroxide solution is added dropwise until a molar ratio of the hydroxide ions to the metal ions reaches 1.7:1. After dripping the potassium hydroxide solution is completed, the mixed solution is stirred at 50° C. for 2 hours to obtain a uniform and transparent solution. Then, a 3:1 volume ratio of heptane solvent is added to the uniform and transparent solution to produce a large amount of white precipitate in the transparent solution. The turbid solution is centrifuged at 7,000 rpm, and the resulting white precipitate is dissolved in the methanol solvent again. This cleaning process is repeated four times. The resulting white precipitate is dissolved in an appropriate amount of ethanol solvent to obtain a lanthanum ion-doped zinc oxide colloid solution with a concentration of 30 mg/ml.

The resulting 30 mg/ml lanthanum ion-doped zinc oxide colloid solution is deposited by spin-coating on a substrate that has already been sequentially deposited with an anode, a hole transport layer, and a quantum dot light emitting layer, and is annealed at 100° C. in an argon gas environment, thereby forming the lanthanum ion-doped nano-zinc oxide electron transport layer. The spin-coating speed is 3,000 rpm. The spin-coating time is 30 seconds. The thickness of the doped zinc oxide electron transport layer is controlled to be approximately 50 nm.

Embodiment 2

A method for forming an yttrium ion-doped nano-zinc oxide electron transport thin film includes the following steps.

First, an appropriate amount of zinc nitrate and yttrium chloride is added to 50 ml of ethanol solvent to form a mixed salt solution with a total concentration of 0.1 mol/L. The doping molar concentration of $Y^{3+}$ is 7%. At the same time, an appropriate amount of lithium hydroxide powder is dissolved into another 50 ml ethanol solvent to form an alkaline solution with a concentration of 0.2 mol/L. Then, the mixed salt solution is heated to 40° C., and a lithium hydroxide solution is added dropwise until a molar ratio of the hydroxide ions to the metal ions reaches 1.9:1. After dripping the lithium hydroxide solution is completed, the mixed solution is stirred at 30° C. for 1 hour to obtain a uniform and transparent solution. Then, a 4:1 volume ratio of ethyl acetate solvent is added to the uniform and transparent solution to produce a large amount of white precipitate in the transparent solution. The turbid solution is centrifuged at 7,000 rpm, and the resulting white precipitate is dissolved in the ethanol solvent again. This cleaning process is repeated four times. The resulting white precipitate is dissolved in an appropriate amount of ethanol solvent to obtain an yttrium ion-doped zinc oxide colloid solution with a concentration of 30 mg/ml.

The resulting 30 mg/ml yttrium ion-doped zinc oxide colloid solution is deposited by spin-coating on a substrate that has already been sequentially deposited with an anode, a hole transport layer, and a quantum dot light emitting layer, and is annealed at 100° C. in an argon gas environment, thereby forming the yttrium ion-doped nano-zinc oxide electron transport layer. The spin-coating speed is 1,500 rpm. The spin-coating time is 30 seconds. The thickness of the doped zinc oxide electron transport layer is controlled to be approximately 80 nm.

Embodiment 3

A method for forming a gadolinium ion-doped nano-zinc oxide electron transport thin film includes the following steps.

First, an appropriate amount of zinc sulfate and gadolinium acetate is added to 50 ml of DMSO solvent to form a mixed salt solution with a total concentration of 0.1 mol/L. The doping molar concentration of $Gd^{3+}$ is 5%. At the same time, an appropriate amount of TMAH powder is dissolved into another 30 ml ethanol solvent to form an alkaline solution with a concentration of 0.3 mol/L. Then, the mixed salt solution is kept at room temperature, and the TMAH solution is added dropwise until a molar ratio of the hydroxide ions to the metal ions reaches 1.5:1. After dripping the TMAH solution is completed, the mixed solution is stirred at room temperature for 2 hours to obtain a uniform and transparent solution. Then, a 4:1 volume ratio of n-hexane solvent is added to the uniform and transparent solution to produce a large amount of white precipitate in the transparent solution. The turbid solution is centrifuged at 7,000 rpm, and the resulting white precipitate is dissolved in the ethanol solvent again. This cleaning process is repeated four times. The resulting white precipitate is dissolved in an appropriate amount of ethanol solvent to obtain a gadolinium ion-doped zinc oxide colloid solution with a concentration of 30 mg/ml.

The resulting 30 mg/ml gadolinium ion-doped zinc oxide colloid solution is deposited by spin-coating on a substrate that has already been sequentially deposited with an anode, a hole transport layer, and a quantum dot light emitting layer, and is annealed at 100° C. in a nitrogen gas environment, thereby forming the gadolinium ion-doped nano-zinc oxide electron transport layer. The spin-coating speed is 4,500 rpm. The spin-coating time is 30 seconds. The thickness of the doped zinc oxide electron transport layer is controlled to be approximately 20 nm.

Embodiment 4

A method for forming a cerium ion-doped nano-zinc oxide electron transport thin film includes the following steps.

First, an appropriate amount of zinc chloride and cerium nitrate is added to 50 m of methanol solvent to form a mixed salt solution with a total concentration of 0.1 mol/L. The doping molar concentration of $Ce^{4+}$ is 8%. At the same time, an appropriate amount of ethylenediamine solution is diluted into another 50 ml methanol solvent to form an alkaline solution with a concentration of 0.3 mol/L. Then, the mixed salt solution is heated to 50° C., and the ethylenediamine solution is added dropwise until a molar ratio of the hydroxide ions to the metal ions reaches 1.8:1. After dripping the ethylenediamine solution is completed, the mixed solution is stirred at 50° C. for 1 hour to obtain a uniform and transparent solution. Then, a 3:1 volume ratio of acetone solvent is added to the uniform and transparent solution to produce a large amount of white precipitate in the transparent solution. The turbid solution is centrifuged at 7,000 rpm, and the resulting white precipitate is dissolved in the methanol solvent again. This cleaning process is repeated four times. The resulting white precipitate is dissolved in an appropriate amount of ethanol solvent to obtain a cerium ion-doped zinc oxide colloid solution with a concentration of 30 mg/ml.

The resulting 30 mg/ml gadolinium ion-doped zinc oxide colloid solution is deposited by spin-coating on a substrate that has already been sequentially deposited with an anode, a hole transport layer, and a quantum dot light emitting layer, and is annealed at 100° C. in a nitrogen gas environment, thereby forming the gadolinium ion-doped nano-zinc oxide electron transport layer. The spin-coating speed is 3,000 rpm. The spin-coating time is 30 seconds. The thickness of the doped zinc oxide electron transport layer is controlled to be approximately 50 nm.

Embodiments 5-8

Referring to FIG. 2, a positive-type QLED device includes, sequentially from bottom to top, a substrate 1, an anode 2, a hole transport layer 3, a quantum dot light emitting layer 4, an electron transport layer 5, and a cathode 6. The substrate 1 is made of a glass sheet. The anode 2 is made of an ITO substrate. The hole transport layer 3 is made of TFB. The electron transport layer 5 is made of zinc oxide doped with metal ions having a substantially large ion radius and a different valence state. The cathode 6 is made of Al.

A method for forming the positive-type QLED device includes the following steps.

The hole transport layer is formed on the ITO substrate by spin-coating.

The quantum dot light emitting layer is formed on the hole transport layer by spin coating.

According to the methods of the embodiments 1-4, respectively, the doped zinc oxide colloid solution is spin-coated on the quantum dot light emitting layer and is dried to form the nano-zinc oxide electron transport layer.

The cathode is evaporated on the nano-zinc oxide electron transport layer to obtain the quantum dot light emitting diode.

Embodiments 9-12

An OLED device sequentially includes a substrate, an anode, a hole transport layer, an organic light emitting layer, an electron transport layer, and a cathode. The substrate is made of a glass sheet. The anode is made of an ITO substrate. The hole transport layer is made of TFB. The electron transport layer is made of zinc oxide doped with metal ions having a substantially large ion radius and a different valence state. The cathode is made of Al.

A method for forming the QLED device includes the following steps.

The hole transport layer is formed on the ITO substrate by spin-coating.

The organic light emitting layer is formed on the hole transport layer by spin coating.

According to the methods of the embodiments 1-4, respectively, the doped zinc oxide colloid solution is spin-coated on the organic light emitting layer and is subject to a low-temperature treatment to form the nano-zinc oxide electron transport layer.

The cathode is evaporated on the nano-zinc oxide electron transport layer to obtain the organic light emitting diode.

Various embodiments of the present invention are merely used to illustrate the technical solution of the present disclosure, but the scope of the present disclosure is not limited thereto. Although the present disclosure has been described in detail with reference to the foregoing embodiments, those skilled in the art should understand that the technical solution described in the foregoing embodiments can still be modified or some or all technical features can be equivalently replaced. Without departing from the spirit and principles of the present disclosure, any modifications, equivalent substitutions, and improvements, etc. shall fall within the scope of the present disclosure. Thus, the scope of invention should be determined by the appended claims.

What is claimed is:

1. An electron transport thin film, comprising:
nano-zinc oxide doped with metal ions, wherein the nano-zinc oxide doped with the metal ions is nano-zinc oxide having a surface enriched with the metal ions;
wherein a valence state of the dopant metal ions is not positive divalent; and
an ion radius of the dopant metal ions is approximately between 130% and 200% of the radius of $Zn^{2+}$ ions.

2. The electron transport thin film of claim 1, wherein:
the dopant metal ions are rare earth metal ions.

3. The electron transport thin film of claim 2, wherein:
the dopant metal ions are selected from at least one of $La^{3+}$, $Y^{3+}$, $Gd^{3+}$, or $Ce^{4+}$.

4. The electron transport thin film of claim 3, wherein:
the electron transport thin film is nano-zinc oxide electron transport thin film containing the dopant metal ions; and
if an overall molar concentration of metal elements in the electron transport thin film is 100%, a dopant molar concentration of $La^{3+}$ ions is approximately between 0.05% and 5%, or a dopant molar concentration of $Y^{3+}$ ions is approximately between 0.1% and 10%, or a dopant molar concentration of $Gd^{3+}$ ions is approximately between 0.1% and 8%, or a dopant molar concentration of $Ce^{4+}$ ions is approximately between 0.2% and 10%.

5. The electron transport thin film of claim 1, wherein:
a thickness of the electron transport thin film is approximately between 10 nm and 100 nm.

6. A light emitting diode device comprising an electron transport thin film, wherein:
the electron transport thin film is comprised of nano-zinc oxide containing dopant metal ions;
the nano-zinc oxide doped with the metal ions is nano-zinc oxide having a surface enriched with the metal ions;
wherein a valence state of the dopant metal ions is not positive divalent; and
an ion radius of the dopant metal ions is approximately between 130% and 200% of the radius of $Zn^{2+}$ ions.

* * * * *